US009570296B2

(12) United States Patent
Cheng et al.

(10) Patent No.: US 9,570,296 B2
(45) Date of Patent: *Feb. 14, 2017

(54) PREPARATION OF LOW DEFECT DENSITY OF III-V ON SI FOR DEVICE FABRICATION

(71) Applicant: International Business Machines Corporation, Armonk, NY (US)

(72) Inventors: Cheng-Wei Cheng, White Plains, NY (US); Devendra K. Sadana, Pleasantville, NY (US); Kuen-Ting Shiu, Yorktown Heights, NY (US); Yanning Sun, Scarsdale, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/744,145

(22) Filed: Jun. 19, 2015

(65) Prior Publication Data
US 2016/0322223 A1    Nov. 3, 2016

Related U.S. Application Data

(63) Continuation of application No. 14/697,953, filed on Apr. 28, 2015.

(51) Int. Cl.
*H01L 29/20* (2006.01)
*H01L 21/02* (2006.01)

(52) U.S. Cl.
CPC ... *H01L 21/02546* (2013.01); *H01L 21/02178* (2013.01); *H01L 21/02241* (2013.01); *H01L 21/02381* (2013.01)

(58) Field of Classification Search
CPC ............ H01L 29/205; H01L 29/66462; H01L 29/7783; H01L 21/02381; H01L 21/02463; H01L 21/0251
See application file for complete search history.

(56) References Cited

U.S. PATENT DOCUMENTS 5,136,347 A * 8/1992 Nishimura ........ H01L 21/02381
117/89
5,621,227 A * 4/1997 Joshi .................... H01L 27/1446
257/184
5,834,362 A * 11/1998 Miyagaki .......... H01L 21/02381
257/E21.127

(Continued)

OTHER PUBLICATIONS

Cheng-Wei Cheng, et al.; "Preparation of Low Defect Density of III-V on Si for Device Fabrication"; U.S. Appl. No. 14/697,953, filed Apr. 28, 2015.

(Continued)

*Primary Examiner* — Eric Ward
(74) *Attorney, Agent, or Firm* — Cantor Colburn LLP

(57) ABSTRACT

A method of forming a semiconducting material includes depositing a graded buffer on a substrate to form a graded layer of an indium (In) containing III-V material, the In containing III-V material being indium-gallium-arsenic (InGaAs) or indium-aluminum-arsenic (InAlAs) and comprising In in an increasing atomic gradient up to 35 atomic % (at. %) based on total atomic weight of InGa or InAl; and forming a layer of InGaAs on the graded layer, the layer of InGaAs comprising about 25 to about 100 at. % In based on total atomic weight of InGa.

14 Claims, 6 Drawing Sheets

(56) References Cited

U.S. PATENT DOCUMENTS

| | | | | |
|---|---|---|---|---|
| 5,874,349 A * | 2/1999 | Naniwae | H01L 33/0087 | 257/E21.461 |
| 6,649,287 B2 * | 11/2003 | Weeks, Jr. | C30B 23/02 | 257/E21.125 |
| 7,566,898 B2 * | 7/2009 | Hudait | H01L 21/02381 | 257/194 |
| 7,687,799 B2 * | 3/2010 | Hudait | B82Y 10/00 | 257/14 |
| 8,120,147 B1 * | 2/2012 | Sugg | H01L 29/0817 | 257/562 |
| 8,466,493 B2 * | 6/2013 | Cheng | H01L 29/0653 | 257/192 |
| 8,617,971 B2 * | 12/2013 | Hekmatshoartabari | H01L 27/12 | 438/478 |
| 8,796,117 B2 * | 8/2014 | Yi Chang | H01L 29/7784 | 257/E29.246 |
| 8,809,836 B2 * | 8/2014 | Pillarisetty | H01L 29/66462 | 257/192 |
| 8,828,824 B2 * | 9/2014 | Cheng | H01L 29/0653 | 257/192 |
| 2003/0132496 A1 * | 7/2003 | Terano | H01L 29/475 | 257/449 |
| 2009/0045437 A1 * | 2/2009 | Sandhu | H01L 21/02392 | 257/190 |
| 2012/0261721 A1 * | 10/2012 | Hoke | H01L 21/02378 | 257/200 |
| 2013/0277713 A1 * | 10/2013 | Chyi | H01L 29/205 | 257/190 |
| 2015/0244151 A1 * | 8/2015 | Liu | H01S 5/021 | 372/44.01 |

OTHER PUBLICATIONS

List of IBM Patents or Patent Applications Treated as Related—Date Filed: Aug. 17, 2015; 1 page.

* cited by examiner

PREPARATION OF LOW DEFECT DENSITY OF III-V ON SI FOR DEVICE FABRICATION

PRIORITY

This application is a continuation of and claims priority from U.S. patent application Ser. No. 14/697,953, filed on Apr. 28, 2015, entitled "PREPARATION OF LOW DEFECT DENSITY OF III-V SI FOR DEVICE FABRICATION", the entire contents of which are incorporated herein by reference.

BACKGROUND

The present disclosure generally relates to semiconductor devices, and more specifically, to semiconducting materials on silicon substrates.

Semiconducting III-V compounds and materials, e.g., indium-gallium-arsenic (InGaAs) and indium-gallium-antimony (InGaSb), in transistor channel devices have low band gaps and high carrier mobility properties. However, integrating the III-V materials on silicon (Si) or germanium (Ge) substrates is challenging. Generally, conventional III-V materials on Si substrates need a relatively thick buffer layer to achieve an acceptable defect density. Defects, such as stacking faults and dislocations can occur with high defect densities due the lattice mismatch between the III-V and the substrate.

Thick buffer layers, including graded buffer layers, can take extensive time to form and may not provide the desired defect density. For example, a thick graded buffer layer to integrate a III-V material on Si may only achieve a defect density of about $2 \times 10^9$ defects/centimeter$^2$ (defects/cm$^2$), which is demonstrated by Intel Corp.

SUMMARY

In one embodiment of the present disclosure, a method of forming a semiconducting material includes depositing a graded buffer on a substrate to form a graded layer of an indium (In) containing III-V material, the In containing III-V material being indium-gallium-arsenic (InGaAs) or indium-aluminum-arsenic (InAlAs) and comprising In in an increasing atomic gradient up to 35 atomic % (at. %) based on total atomic weight of InGa or InAl; and forming a layer of InGaAs on the graded layer, the layer of InGaAs comprising about 25 to about 100 at. % In based on total atomic weight of InGa.

In another embodiment, a method of forming a semiconducting material includes forming a high aluminum content III-V material layer on a substrate, the III-V material comprising at least one III element and a V element, the at leasing one III element comprising Al and being present in an amount of least 50 at. % based on total atomic weight of the at least one III element; depositing a graded buffer on the high aluminum content III-V material layer to form a graded layer of an In containing III-V material, the In containing III-V material being InGaAs or InAlAs and comprising In in an increasing atomic gradient up to 35 at. % based on total atomic weight of InGa or InAl; forming a layer of InGaAs on the graded layer, the layer of InGaAs comprising about 25 to about 100 at. % In based on total atomic weight of InGa; and oxidizing the high aluminum content III-V material layer to form AlO.

Yet, in another embodiment, a semiconducting material includes a substrate; a high aluminum content III-V material layer disposed on the substrate, the III-V material layer comprising at least one III element and a V element, the at leasing one III element comprising Al and being present in an amount of least 50 at. % based on total atomic weight of the at least one III element; a graded layer of an In containing III-V material disposed on the high aluminum content III-V material layer, the In containing III-V material being InGaAs or InAlAs and comprising In in an increasing atomic gradient up to 35 at. % based on total atomic weight of InGa or InAl; and a InGaAs layer disposed on the graded layer, the InGaAs layer comprising about 25 to about 100 at. % In based on total atomic weight of InGa.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1A:
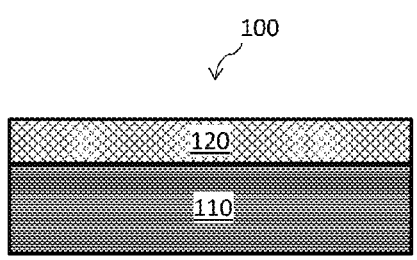
FIG. 1A illustrates a cross-sectional side view of high aluminum content III-V layer disposed on a substrate.

Disclosed herein are semiconducting materials and methods of making thereof. Semiconducting materials include III-V materials on a substrate. In some embodiments, the III-V material is an In containing III-V material, such as InGaAs or InAlAs. The substrate can be, for example, a Ge/Si substrate, or a substrate with Ge deposited on Si. A high degree of lattice mismatch between Ge and Si can induce defects inside the deposited Ge portion of the substrate. The present disclosure therefore provides for integration of a III-V material on a Si substrate with desirable defect density, for example, less than $2\times10^7$ defects/cm$^2$.

The methods also can be used to apply a III-V material to a Ge substrate directly. Because the starting defect density of Ge is relatively low, for example, less than $1\times10^3$ defects/cm$^2$, the final III-V integrated material (e.g., InGaAs) on the Ge substrate can provide a desirable defect density, for example, about $1\times10^6$ defects/cm$^2$.

In one embodiment, optionally, a high aluminum content III-V material layer is formed on the substrate before integrating the III-V material, which serves as a layer for later oxidation. Graded layers of an indium (In) containing III-V material is formed on the high aluminum content III-V material layer. In an exemplary embodiment, a portion of the graded layer includes (In$_{0.35}$Ga$_{0.65}$As). A thin layer of InGaAs having about 25 to about 100 at. % In is then formed on the graded layer. The resulting semiconducting materials have low defect densities, for example, less than $2\times10^7$ defects/cm$^2$, and are substantially stacking fault free.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

As used herein, the term "III-V material" means a material or compound including at least one III element and at least one V element.

As used herein, the term "III element" means aluminum (Al), boron (B), gallium (Ga), indium (In), or any combination thereof.

As used herein, the term "V element" means nitrogen (N), phosphorous (P), arsenic (As), antimony (Sb), or any combination thereof.

Referring now to the figures, FIG. 1A illustrates a cross-sectional side view of a semiconducting material 100 according to an exemplary embodiment. Optionally, a high aluminum content III-V material layer 120 is disposed on a substrate 110. The high aluminum content III-V material layer 120 can be, for example, AlAs. The high aluminum content III-V material layer can serve as an oxidation layer, as discussed below. In some embodiments, the semiconducting material 100 does not include a high aluminum content III-V material layer.

The substrate 110 includes any suitable substrate material. Non-limiting examples of suitable substrate materials include p-type materials, n-type materials, neutral-type materials, silicon, germanium, gallium silicon, germanium arsenide, silicon germanium, silicon-on-insulator, or any combination thereof.

In an exemplary embodiment, the substrate 110 is a Ge/Si substrate. Ge is deposited on an off-cut Si wafer before the below III-V materials. One 1 micrometer (μm) Ge on a 6 degree off-cut Si wafer can be used. The Ge/Si substrate has a defect density of about $1\times10^7$ to $1\times10^9$ defects/cm$^2$.

The thickness of the substrate 110 is not intended to be limited. In one embodiment, the thickness of the substrate 110 is in a range from about 200 micrometers (μm) to about 1,000 μm. In another embodiment, the thickness of the substrate 110 is in a range from about 600 μm to about 800 μm. Yet, in another embodiment, the thickness of the substrate 110 is about or in any range from about 200, 300, 400, 500, 600, 700, 800, 900, and 1,000 μm.

The beginning substrate 110 has a defect density (DD) in a range from about $1\times10^2$ to about $1\times10^9$ defects/cm$^2$. In some embodiments, the substrate has a defect density of less than $2\times10^8$ defects/cm$^2$.

The optional high aluminum content III-V material layer 120 is formed on the substrate 110 from a III-V material. The III-V material includes at least one III element and a V element. At least one of the one or more III elements is Al. Al is present in an amount of least 50 at. % based on total atomic weight of the one or more III elements. In other embodiments, Al is present in an amount of at least 55, at least 60, at least 65, at least 70, at least 75, at least 80, at least 85, at least 85, at least 90, at least 95, or at least 100 at. % based on total atomic weight of the one or more III elements. For example, Al In one example, the high aluminum content III-V material layer 120 includes aluminum (Al) (a III element) and arsenic (As) (a V element) and is AlAs. AlAs includes 100 at. % Al based on total atomic weight of the III elements.

The high aluminum content III-V material layer 120 is formed on the substrate 110 by, for example, metal organic chemical vapor deposition, molecular beam epitaxy, photolithography, or other such suitable processes.

The thickness of the high aluminum content III-V material layer 120 is not intended to be limited. In one embodiment, the high aluminum content III-V material layer 120 has a thickness in a range from about 1 nm to about 1 μm. In other embodiments, the high aluminum content III-V material layer 120 has a thickness in a range from about 1 nm to about 10 nm. In another embodiment, the high aluminum content III-V material layer 120 has a thickness about or in any range from about 1 nm, 10 nm, 50 nm, 100 nm, 250 nm, 500 nm, 750 nm, and 1 μm.

Figure 1B:
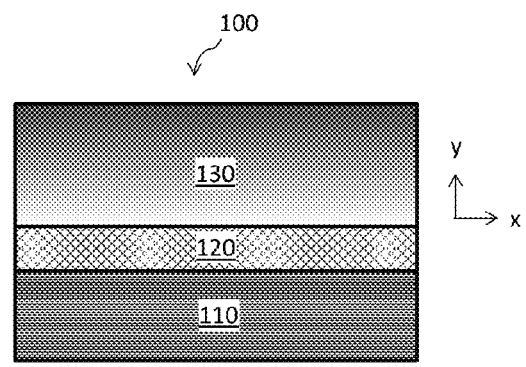
FIG. 1B illustrates a cross-sectional side view of a graded layer disposed on the high aluminum content III-V layer of FIG. 1A.

FIG. 1B illustrates a cross-sectional side view of a graded layer 130 disposed onto the optional high aluminum content III-V material layer 120 of FIG. 1A. Depositing a graded buffer on the high aluminum content III-V material layer 120 forms the graded layer 130. The graded layer 130 can be deposited, for example, by metal organic chemical vapor deposition (MOCVD) or molecular beam epitaxy (MBE). In one embodiment, the graded layer 130 is formed directly on the substrate 110 (not shown).

The optional high aluminum content III-V material layer 120 can serve as an oxidation layer. Because the oxidation rate depends on Al content, at least 50 at. % Al is used. Using a layer of AlAs, which is then oxidized to AlO, reduces leakage to the substrate.

As discussed above, the high aluminum content III-V material layer 120 can be any III-V material that includes Al as a III element component in an amount of at least 50 at. %. For example, the high aluminum content III-V material can be Al—V, wherein V is any V element(s), for example, nitrogen (N), phosphorous (P), arsenic (As), antimony (Sb), or any combination thereof. Al is present as the III element alone or in combination with other III elements, for example, boron (B), gallium (Ga), indium (In), or any combination thereof. The high aluminum content III-V material layer 120 can include Al as the III element component in an amount about or in any range from about 50, 55, 60, 65, 70, 75, 80, 85, 90, 95, and 100 at. %.

According to an exemplary embodiment, the high aluminum content III-V material layer 120 is $Al0._{95}Ga_{0.05}As$, wherein the III element portion is 95 at. % Al and 5 at. % Ga, and the V element portion is P.

According to another exemplary embodiment, the high aluminum content III-V material layer is $In_{0.5}Al0._{5}P$, wherein the III element portion is 50 at. % In and 50 at. % Al, and the V element portion is P.

After the high aluminum content III-V material layer 120 is optionally deposited on the substrate, the graded layer 130 is formed. For example, GaAs is deposited (without In). The In content is gradually increased, while simultaneously decreasing the Ga content.

To form the graded layer, In must be present in a III-V material together with another III element. As In at. % increases, another III element at. % decreases. The V element portion remains substantially constant.

In another example, the graded layer 130 can be formed by initially depositing a substantially pure layer of GaAs and then subsequently depositing a layer of $In_{0.2}Ga_{0.8}As$ on top.

The graded layer 130 includes InGaAs or InAlAs with an increasing atomic gradient of In up to 35 at. % (as the III element portion) in the y-axis direction (see FIG. 1B). In some embodiments, the graded layer 130 includes InGaAs or InAlAs with an increasing In atomic gradient from about 0 at. % to about 35 at. % in the y-axis direction. Higher atomic gradients (including more than 35 at. % In.) are not used because phase separation can occur at higher amounts, which could increase the dislocation density and roughness.

The graded layer 130 includes an In atomic gradient, which can be a linear or step-wise gradient of discrete graded layers. For example, the graded layer 130 can include a steady linear atomic gradient of In from about 0 to about 35 at. %. In other embodiments, the graded layer 130 includes a step-wise atomic gradient of In up to 35 wt. %, for example, discrete layers of increasing amounts of In (e.g., 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, and 35 at. %). Although, other step-wise atomic gradients of larger discrete layers can be used.

The graded buffer is used to form a graded layer 130 having a thickness in a range from about 100 nm to about 10 μm. In one embodiment, the thickness of the graded layer 130 is in a range from about 0.5 to about 1.5 μm. In some embodiments, the thickness of the graded layer 130 is about or in any range from about 100 nm, 500 nm, 1 μm, 2 μm, 5 μm, 7 μm, and 10 μm.

Figure 1C:
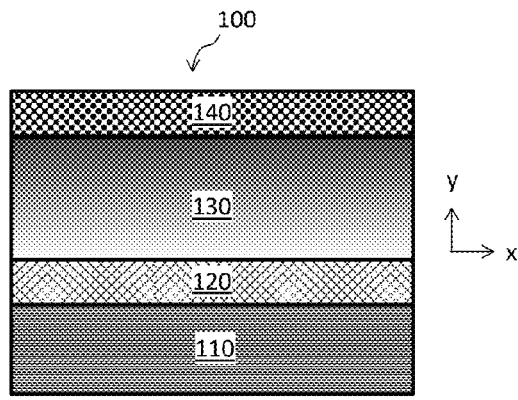
FIG. 1C illustrates a cross-sectional side view of an indium-gallium-arsenic layer (InGaAs) disposed on the graded layer of FIG. 1B.

FIG. 1C illustrates a cross-sectional side view of an InGaAs layer 140 disposed on the graded layer 130 of FIG. 1B. The InGaAs layer 140 is strained and thinner than the graded layer 130 and has a thickness in a range from about 1 nm to about 20 nm. The InGaAs layer 140 forms a channel layer that can be used in transistor devices, for example, planar transistors, high electron mobility transistors (HEMT), or fin field effect transistors (FinFET). In some embodiments, the InGaAs layer 140 has a thickness in a range from about 5 nm to about 15 nm. In other embodiments, the InGaAs layer has a thickness about or in any range from about 1, 2, 5, 7, 10, 12, 15, 17, and 20 nm.

Figure 2:
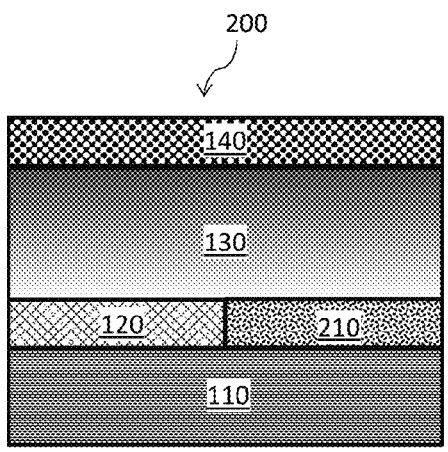
FIG. 2 illustrates a cross-sectional side view of a semiconducting material having a partially oxidized high aluminum content III-V material layer according to an exemplary embodiment.

FIG. 2 illustrates a cross-sectional side view of a semiconducting material 200 having a partially oxidized high aluminum content material layer 120 according to an exemplary embodiment. The high aluminum content III-V material layer 120 is oxidized to include one or more AlO portions 210. The high aluminum content III-V material layer 120 with the AlO portion 210 is formed on the substrate 110. The graded layer 130 is formed on the high aluminum content III-V material layer 120 portions and AlO portions. The InGaAs layer 140 is formed on the graded layer 130.

The amount or fraction of the high aluminum content III-V material layer 120 that is oxidized to the AlO portion 210 is not intended to be limited. For example, the semiconducting material 200 can include a majority of unoxidized portions of a majority of AlO. Partially oxidizing the high aluminum content III-V material layer 120 can be performed in any manner such that a portion of the high aluminum content III-V material layer 120 includes AlO.

Any oxidation processes can be used. For example, a hydrothermal treatment, such as wet oxidation, can be used. In wet oxidation, the high aluminum content III-V material layer 120 on the substrate 110 is suspended in water (or water vapor) and oxygen is used as the oxidizer. Alternatively, air can be used as the oxidizer (referred to as wet air oxidation (WAO)). The water is superheated to a temperature above the normal boiling point of water (100° C.), but below the critical point (374° C.). During wet oxidation, the system is maintained under pressure to avoid excessive evaporation of water.

In an exemplary embodiment, oxidizing the high aluminum content III-V material layer 120 includes flowing nitrogen gas and water vapor onto the high aluminum content III-V material layer 120. Then the high aluminum content III-V material layer 120 is heated to a temperature in a range from about 100 to about 400° Celsius (° C.) to oxidize the material to AlO. Because oxidation of the high aluminum content III-V material layer 120 is faster than GaAs, the high aluminum content III-V material layer 120 is selectively oxidized.

Figure 3:
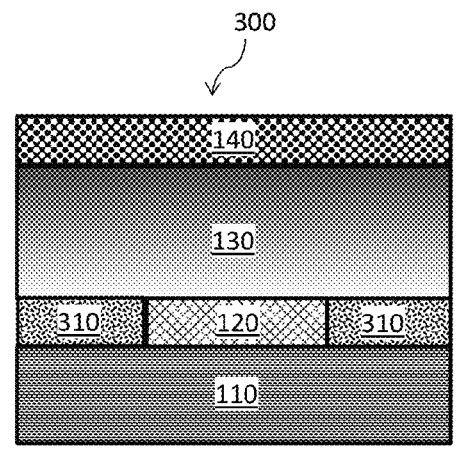
FIG. 3 illustrates a cross-sectional side view of a semiconducting material having a high aluminum content III-V material with partial oxidation along lateral edges of the high aluminum content III-V material layer.

FIG. 3 illustrates a cross-sectional side view of a semiconducting material 300 having a high aluminum content III-V material layer 120 partially oxidized along lateral edges according to an exemplary embodiment. The AlO portions 310 can be any fraction or portion of the high aluminum content III-V material layer 120. The high aluminum content III-V material layer 120 with AlO portions 310 are formed on the substrate 110. The graded layer 130 is formed on the high aluminum content III-V material layer 120 with AlO portions 310. The InGaAs layer 140 is formed on the graded layer 130.

Figure 4:
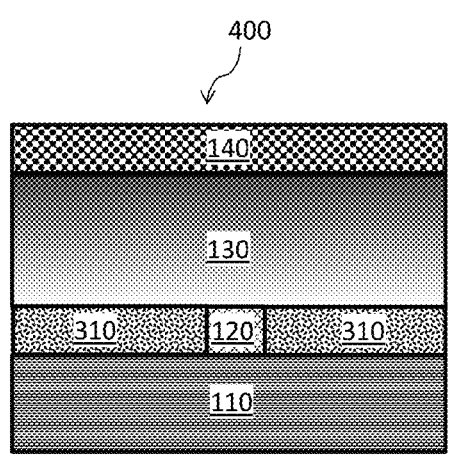
FIG. 4 illustrates a cross-sectional side view of a semiconducting material having a high aluminum content III-V material layer that is substantially fully oxidized to aluminum oxide (AlO)

FIG. 4 illustrates a cross-sectional side view of a semiconducting material 400 having a high aluminum content III-V material layer 120 that is substantially fully oxidized to AlO according to an exemplary embodiment. When oxidation begins on the lateral edges of the high aluminum content III-V material layer 120, any un-oxidized remaining portion will remain in a central region of the high aluminum content III-V material layer 120. The high aluminum content III-V material layer 120 with AlO portions 310 are formed on the substrate 110. The graded layer 130 is formed on the high aluminum content III-V material layer 120 with AlO portions 310. The InGaAs layer 140 is formed on the graded layer 130. The high aluminum content III-V material layer 120 can be fully oxidized to AlO.

The semiconducting materials 100, 200, 300, and 400 described above have dislocation densities in a range from about $1 \times 10^2$ to about $1 \times 10^9$ defects/cm$^2$. In some embodiments, the semiconducting materials disclosed herein have dislocation densities in a range from about $1 \times 10^6$ to about $1 \times 10^8$ defects/cm$^2$. In other embodiments, the semiconducting materials have defect densities of less than $2 \times 10^9$ defects/cm$^2$.

The defect density is determined using a plan-view TEM image under two beam conditions. Defects include dislocations and stacking faults.

The semiconducting materials disclosed herein are substantially free of stacking faults. The presence of stacking defaults is determined by analyzing plan-view TEM images.

The semiconducting materials have an average roughness (RMS) of less than 10 nanometers (nm). In some embodiments, the semiconducting materials have a RMS of less than 6 nm.

The average roughness, or RMS, is determined by AFM. The AFM instrument can provide the roughness RMS value directly. The RMS value ($R_q$) is determined using the following equation:

$$R_q = \sqrt{\frac{1}{n} \sum_{i=1}^{n} y_i^2},$$

wherein $y_i$ is ($R_i - R_{av}$), $R_i$ is measured roughness, and $R_{av}$ is the average roughness.

EXAMPLES

Example 1

Figure 5A:
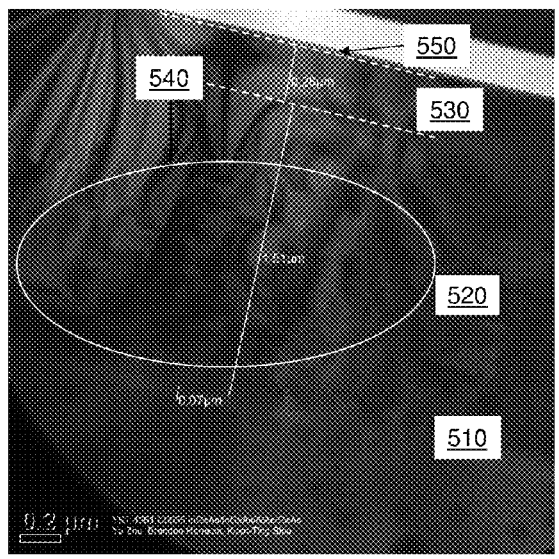
FIG. 5A is a transmission electron micrograph (TEM) image of a cross-sectional view of a graded layer of InGaAs having an increasing In atomic gradient up to 20%.

FIG. 5A is a TEM image of a cross-sectional view of a graded layer 520 of InGaAs having an increasing In atomic gradient up to 20%. The AlAs layer 510 had a thickness of 0.07 micrometers, the graded layer 520 on the substrate 510 had a thickness of 1.51 micrometers, and the relaxed InGaAs layer 530 on the graded layer 520 had a thickness of 0.28 micrometers. The thin strained InGaAs layer 550 included 44% In. The dislocation network region 540 showed that substantially no phase separation occurred.

Figure 5B:
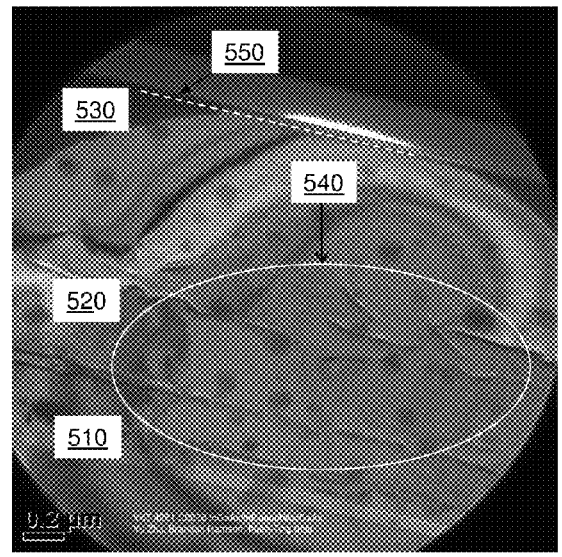
FIG. 5B is a TEM image of a cross-sectional view of a graded layer of InGaAs having an increasing atomic gradient of In up to 20%.

FIG. 5B is a TEM image of a cross-sectional view of a graded layer 520 of InGaAs having an increasing atomic gradient of In up to 20%. The graded layer 520 was formed on the AlAs layer 510, and the thin strained InGaAs layer 530 was formed on the graded layer 520. The dislocation network region 540 showed that substantially no phase separation occurred.

Example 2

Figure 6A:
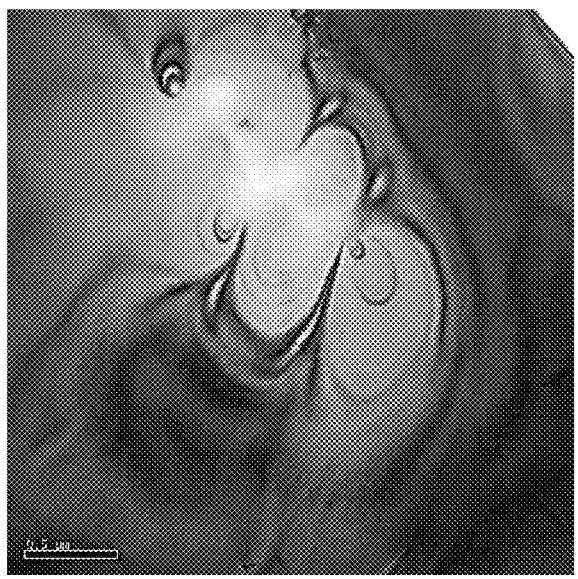
FIG. 6A is a TEM image of plan-view of an InGaAs layer.

FIG. 6A is a plan-view TEM image of top view of a InGaAs layer formed on a graded layer as disclosed herein. As shown, the InGaAs layer was substantially free of stacking faults. The dislocation density also was reduced to about $1 \times 10^7$ defects/cm$^2$.

Figure 6B:
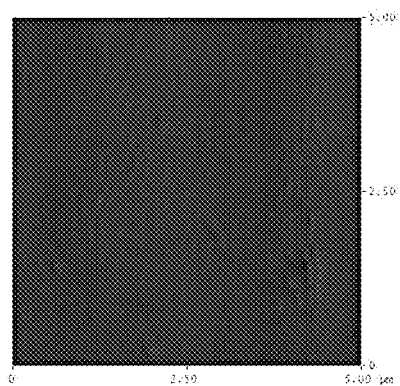
FIG. 6B is an atomic force microscopic (AFM) image of an InGaAs layer disposed on Si.

FIG. 6B is an AFM image of the InGaAs layer disposed on a silicon substrate. The InGaAs layer had an average roughness (RMS) of about 3.12 nm.

Example 3

Figure 7A:
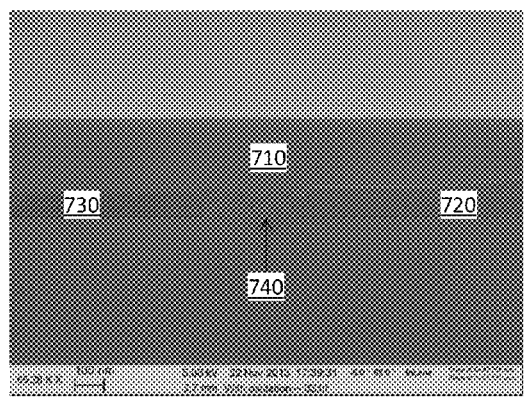
FIG. 7A is a scanning electron microscope (SEM) image showing oxidation of an AlAs layer to AlO.

FIG. 7A is a SEM image showing oxidation of the AlAs layer 720 to AlO 730. An AlAs layer 720 was formed on a substrate. A GaAs layer 740 was formed on the AlAs layer 720. Wet oxidation was performed on the AlAs layer by flowing nitrogen gas and water vapor onto the AlAs layer 720. Then high temperature was used to selectively oxidize the AlAs layer 720 to AlO 730. Oxidation of AlAs layer 720 to AlO 730 began on the lateral edges of the AlAs layer 720, with the oxidation front 740 moving from the edge of the AlAs layer 720 to the central portion of the AlAs layer 720.

Figure 7B:
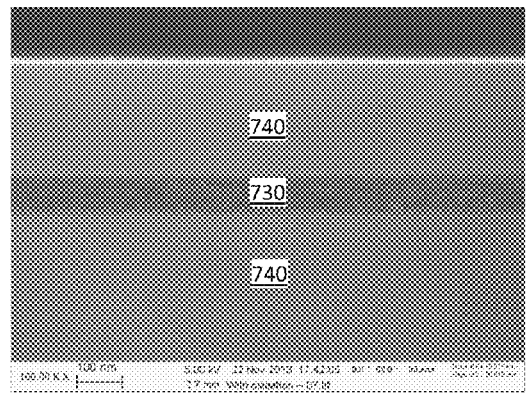
FIG. 7B is a SEM image showing an AlAs layer that is substantially fully oxidized to AlO.

FIG. 7B is a SEM image showing a substantially fully oxidized AlAs layer. The material includes an AlAs layer 720 that is substantially fully oxidized to AlO 730. The AlO layer was formed between two GaAs layers 740.

Example 4

Figure 8A:
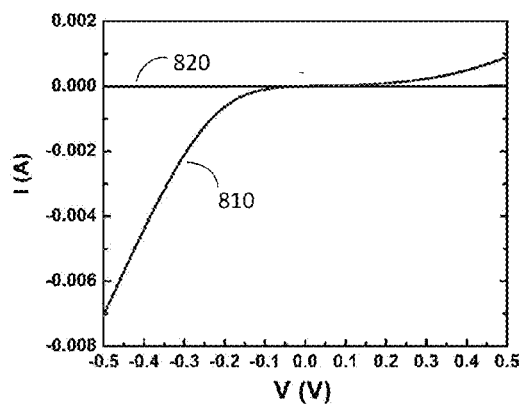
FIG. 8A illustrates linear current as a function of voltage in a semiconducting materials having a partially oxidized AlAs layer and an unoxidized AlAs layer.

FIG. 8A illustrates linear current (Amperes (A)) as a function of voltage (Volts (V)) in semiconducting materials having a partially oxidized AlAs layer 820. For comparison, an unoxidized sample 810 demonstrated current leakage. Thus, partial oxidation of AlAs to AlO reduced substrate/current leakage.

Figure 8B:
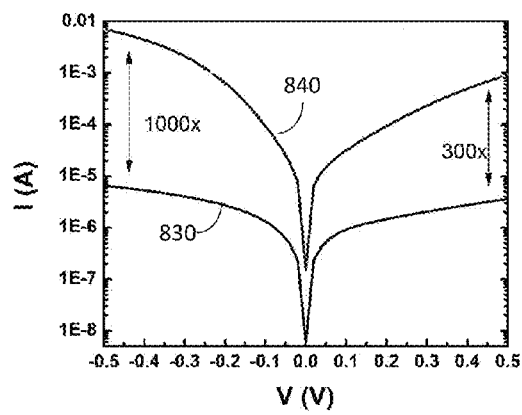
FIG. 8B illustrates a log scale graph of FIG. 8A.

FIG. 8B illustrates a log scale graph of FIG. 8A. Semiconducting materials having partially oxidized 830 and and unoxidized 840 AlAs layers were compared. Curve 840 again showed current leakage when the AlAs was not oxidized.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconducting material, the method comprising:
    depositing a high aluminum content III-V material layer on a substrate, the high aluminum content III-V material layer comprising at least one III element and a V element, the at least one III element comprising Al and being present in an amount of least 50 atomic % (at. %) based on total atomic weight of the at least one III element, and the high aluminum content III-V material layer being partially oxidized to include AlO;
    depositing a graded buffer on the high aluminum content III-V material layer to form a graded layer of an indium (In) containing III-V material, the In containing III-V material being indium-gallium-arsenic (InGaAs) or indium-aluminum-arsenic (InAlAs) and comprising In in an increasing atomic gradient up to 35 atomic % (at.%) based on total atomic weight of InGa or InAl; and
    forming a layer of InGaAs on the graded layer, the layer of InGaAs comprising about 25 to about 100 at. % In based on total atomic weight of InGa.

2. The method of claim 1, wherein the substrate comprises silicon (Si), germanium (Ge), or a combination thereof.

3. The method of claim 1, wherein the high aluminum content III-V material layer is AlAs.

4. The method of claim 1, wherein the graded layer has a thickness in a range from about 100 nanometers (nm) to about 10 micrometers.

5. The method of claim 1, wherein the layer of InGaAs forms a channel layer in a transistor device.

6. The method of claim 1, wherein the high aluminum content III-V material layer has a thickness in a range from about 1 nm to about 1 micrometer.

7. A method of forming a semiconducting material, the method comprising:
    forming a high aluminum content III-V material layer on a substrate, the high aluminum content III-V material comprising at least one III element and a V element, the at least one III element comprising Al and being present in an amount of least 50 at. % based on total atomic weight of the at least one III element;
    depositing a graded buffer on the high aluminum content III-V material layer to form a graded layer of an In containing III-V material, the In containing III-V material being InGaAs or InAlAs and comprising In in an increasing atomic gradient up to 35 at. % based on total atomic weight of InGa or InAl;
    forming a layer of InGaAs on the graded layer, the layer of InGaAs comprising about 25 to about 100 at. % In based on total atomic weight of InGa; and
    oxidizing the high aluminum content III-V material layer to form AlO.

8. The method of claim 7, wherein the layer of InGaAs has a thickness in a range from about 1 to about 20 nm.

9. The method of claim 7, wherein the atomic gradient is a linear gradient.

10. The method of claim 7, wherein the semiconducting material has a dislocation density in a range from about $1 \times 10^2$ to about $1 \times 10^9$ defects/cm$^2$.

11. The method of claim 7, wherein the atomic gradient is a step-wise gradient.

12. The method of claim 7, wherein the semiconducting material has an average roughness (RMS) of less than 6 nanometers (nm).

13. The method of claim 7, wherein the semiconducting material has a defect density of less than $2 \times 10^9$ defects/cm$^2$.

14. The method of claim 7, wherein the oxidizing the high aluminum content III-V material layer comprises flowing nitrogen gas and water vapor onto the high aluminum content III-V material layer.

* * * * *